United States Patent
Kuroda (10) Patent No.: US 9,989,688 B2
(45) Date of Patent: Jun. 5, 2018

(54) POLARIZING PLATE, IMAGE DISPLAY APPARATUS, AND METHOD FOR IMPROVING BRIGHT-PLACE CONTRAST IN IMAGE DISPLAY APPARATUS

(71) Applicant: DAI NIPPON PRINTING CO., LTD., Tokyo (JP)

(72) Inventor: Takashi Kuroda, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days. days.

(21) Appl. No.: 14/779,413

(22) PCT Filed: Dec. 26, 2013

(86) PCT No.: PCT/JP2013/084907
§ 371 (c)(1),
(2) Date: Sep. 23, 2015

(87) PCT Pub. No.: WO2014/155887
PCT Pub. Date: Oct. 2, 2014

(65) Prior Publication Data
US 2016/0054499 A1    Feb. 25, 2016

(30) Foreign Application Priority Data
Mar. 29, 2013  (JP) .................. 2013-074972

(51) Int. Cl.
G02B 5/30        (2006.01)
G02B 27/28      (2006.01)
(Continued)

(52) U.S. Cl.
CPC .............. G02B 5/3083 (2013.01); G02B 1/14 (2015.01); G02B 5/305 (2013.01); G02B 27/286 (2013.01);
(Continued)

(58) Field of Classification Search
None
See application file for complete search history.

(56) References Cited

U.S. PATENT DOCUMENTS

2003/0137732 A1* 7/2003 Sugino ............... B29C 55/04
                                                         359/487.01
2005/0035353 A1  2/2005 Adachi et al.
(Continued)

FOREIGN PATENT DOCUMENTS

CN        1621899 A       6/2005
CN      102597861 A        7/2012
(Continued)

OTHER PUBLICATIONS

International Preliminary Report on Patentabiliy (Application No. PCT/JP2013/084907) dated Oct. 8, 2015.
(Continued)

Primary Examiner — Derek S Chapel
(74) Attorney, Agent, or Firm — Burr & Brown, PLLC (57) ABSTRACT

There is provided a polarizing plate including: a polarizer; and a light transmissive film with a birefringent property in a plane, disposed on one surface of the polarizer, wherein the light transmissive film satisfies a relationship of the following expression (1):

$$n_x > N > n_y \quad (1)$$

where a refractive index in a slow-axis direction which is a direction with a greatest refractive index in a plane of the light transmissive film is $n_x$, a refractive index in a fast-axis direction which is a direction orthogonal to the slow-axis direction in the plane is $n_y$, and an average refractive index of the light transmissive film is N; and wherein the polarizer and the light transmissive film are placed so that both fast-axis direction of the light
(Continued)

transmissive film and absorption-axis direction of the polarizer are along a horizontal direction.

18 Claims, 2 Drawing Sheets

(51) Int. Cl.
  G02F 1/1335 (2006.01)
  G02F 1/13363 (2006.01)
  H01L 51/52 (2006.01)
  G02B 1/14 (2015.01)
(52) U.S. Cl.
  CPC .... G02F 1/13363 (2013.01); G02F 1/133528 (2013.01); H01L 51/5281 (2013.01); *G02F 1/133634* (2013.01)

(56) References Cited

U.S. PATENT DOCUMENTS

| | | |
|---|---|---|
| 2006/0269733 A1 | 11/2006 | Mizuno et al. |
| 2009/0086126 A1 | 4/2009 | Ohgaru et al. |
| 2013/0100378 A1 | 4/2013 | Murata et al. |

FOREIGN PATENT DOCUMENTS

| | | |
|---|---|---|
| CN | 102959459 A | 3/2013 |
| JP | 06-51117 A1 | 2/1994 |
| JP | 09-325216 A1 | 12/1997 |
| JP | 2005-099778 A1 | 4/2005 |
| JP | 2005-157082 A | 6/2005 |
| JP | 2005-196119 A1 | 7/2005 |
| JP | 2007-094396 A1 | 4/2007 |
| JP | 2007-149527 A1 | 6/2007 |
| JP | 2007-279243 A1 | 10/2007 |
| JP | 2009-021408 A | 1/2009 |
| JP | 2011-059488 A | 3/2011 |
| JP | 2011-090042 A | 5/2011 |
| JP | 2012-068641 A | 4/2012 |
| JP | 2012-091496 A | 5/2012 |
| JP | 4962661 | 6/2012 |
| JP | 2012-521578 A | 9/2012 |
| JP | 5051328 B1 | 10/2012 |
| TW | 200512496 A | 4/2005 |
| WO | 2010/110549 A2 | 9/2010 |
| WO | 2011-162198 A1 | 12/2011 |

OTHER PUBLICATIONS

Extended European Search Report (Application No. 13879688.3) dated Oct. 13, 2016.
Chinese Office Action (With English Translation), Chinese Application No. 201380069967.9, dated Oct. 8, 2016 (15 pages).
International Search Report (Application No. PCT/JP2013/084907) dated Mar. 4, 2014.
Taiwanese Office Action (Application No. 103101160) dated Dec. 21, 2015 (with English translation).
Korean Office Action (With English Translation), Korean Application No. 10-2015-7019928, dated Feb. 23, 2017 (11 pages).
Japanese Office Action (Application No. 2015-507969) dated Aug. 15, 2017 (with English translation).
S. Kobayashi, et al. "Optical Materials for FPD," *Monthly Magazine*, "Display" separate volume Oct. 2007, Techno Times Co., Ltd. Oct. 17, 2007, pp. 45-53 with partial English Translation.
Japanese Office Action (with English translation), Japanese Application No. 2015-507969, dated Dec. 22, 2017 (4 pages).

* cited by examiner

POLARIZING PLATE, IMAGE DISPLAY APPARATUS, AND METHOD FOR IMPROVING BRIGHT-PLACE CONTRAST IN IMAGE DISPLAY APPARATUS

FIELD OF THE INVENTION

The present invention relates to a polarizing plate, an image display apparatus, and a method for improving bright-place contrast in an image display apparatus.

BACKGROUND ART

In a liquid crystal display apparatus, a polarizing plate is normally placed in a side closer to an image display surface than a liquid crystal cell. The polarizing plate normally includes a polarizer, such as a polyvinyl alcohol film, that is dyed with iodine or the like and stretched, and a protective film that is affixed to one surface of the polarizer and used for protecting the polarizer.

Conventionally, films comprising cellulose esters represented by triacetylcellulose have been used as protective films. This is based on an advantage that, e.g., water remaining in polarizers can be dried through the cellulose ester films when polarizing plates are produced since the cellulose esters are excellent in transparency and optical isotropy and have appropriate water permeability.

However, there have been problems such as a rise in transmittance due to discoloration and a decrease in polarization degree, caused by conducting a humidity test, because of a cellulose ester having an excessively high water vapor permeability rate. In order to solve the problems, a polarizing plate in which cycloolefin resin is used as a protective film has been proposed (for example, see Japanese Patent Laid-Open No. H06-51117). In addition, it has been desired that general-purpose films that have been inexpensively available on the market compared to cellulose ester films or have been able to be produced by simple methods have been used as protective films in order to improve durability. For example, it has been attempted to utilize a polyester film such as polyethylene terephthalate instead of the cellulose ester films (for example, see Japanese Patent Laid-Open No. 2007-279243).

SUMMARY OF THE INVENTION

Technical Problem

When a polarizing plate including a protective film including various materials was tested for a display apparatus, it was found that bright-place contrast in a display apparatus is improved to such a degree as to be able to be sensed by visual observation in the case of using a polyester film, typically a protective film for a polarizing plate, including polyethylene terephthalate. When the present inventors repeatedly conducted extensive research in this connection, it was found that there is a correlation between the fast axis of a protective film related to a birefringence normally included in a polyester film and improvement in bright-place contrast in a display apparatus. More specifically, it was found that a combination of the direction in itself of the fast axis of the protective film in the state of being incorporated into the display apparatus and, further, a relative relationship between the direction of the fast axis of the protective film and the direction of the absorption axis of a polarizer can greatly influence the bright-place contrast in the display apparatus. When the present inventors further pursued research based on the obtained findings, it was surprisingly found that by daringly allowing even a protective film including a material such as cellulose ester conventionally used as an optically isotropic material to have a birefringence, bright-place contrast in a display apparatus into which a polarizing plate including the protective film is incorporated can be improved. The present invention is based on such findings by the present inventors and is directed at improving contrast in a display apparatus with a polarizing plate by using the polarizing plate including a protective film having a birefringence or by daringly intentionally applying a birefringence to a protective film for a polarizing plate, including a material originally having no birefringence.

Solution to Problem

According to one embodiment of the present invention, there is provided a polarizing plate including: a polarizer; and a light transmissive film with a birefringent property in a plane, disposed on one surface of the polarizer, wherein the light transmissive film satisfies a relationship of the following expression (1):

$$n_x > N > n_y \tag{1}$$

where a refractive index in a slow-axis direction which is a direction with a greatest refractive index in a plane of the light transmissive film is $n_x$, a refractive index in a fast-axis direction which is a direction orthogonal to the slow-axis direction in the plane is $n_y$, and an average refractive index of the light transmissive film is N; and wherein the polarizer and the light transmissive film are placed so that both fast-axis direction of the light transmissive film and absorption-axis direction of the polarizer are along a horizontal direction.

According to another embodiment of the present invention, there is provided an image display apparatus including the polarizing plate, wherein the polarizing plate is placed so that both fast-axis direction of the light transmissive film and absorption-axis direction of the polarizer are along a horizontal direction.

According to another embodiment of the present invention, there is provided a method for improving bright-place contrast in an image display apparatus, wherein the polarizing plate is placed in an image display apparatus so that both fast-axis direction of the light transmissive film and absorption-axis direction of the polarizer in the polarizing plate are along a horizontal direction.

Advantageous Effects of Invention

According to a polarizing plate of one embodiment of the present invention, bright-place contrast can be improved compared to the case of using a light transmissive film with optical isotropy since a light transmissive film having a birefringence is daringly used, the light transmissive film satisfies the expression (1) described above, and a polarizer and the light transmissive film are placed so that both fast-axis direction of the light transmissive film and absorption-axis direction of the polarizer are along a horizontal direction.

According to an image display apparatus of another embodiment of the present invention, bright-place contrast can be improved since the polarizing plate is placed so that both fast-axis direction of the light transmissive film and absorption-axis direction of the polarizer are along a horizontal direction.

According to a method for improving bright-place contrast in an image display apparatus of another embodiment of the present invention, bright-place contrast can be improved since the polarizing plate is placed in an image display apparatus so that both fast-axis direction of the light transmissive film and absorption-axis direction of the polarizer are along a horizontal direction.

DETAILED DESCRIPTION OF THE INVENTION

Figure 1:
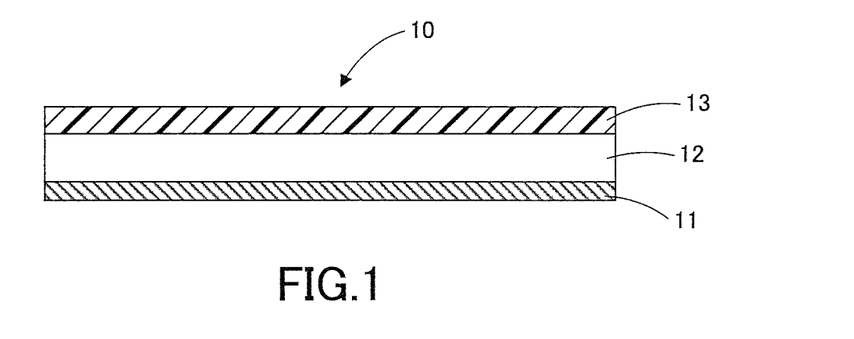
FIG. 1 is a longitudinal cross-sectional view of a polarizing plate according to an embodiment.
Figure 2:
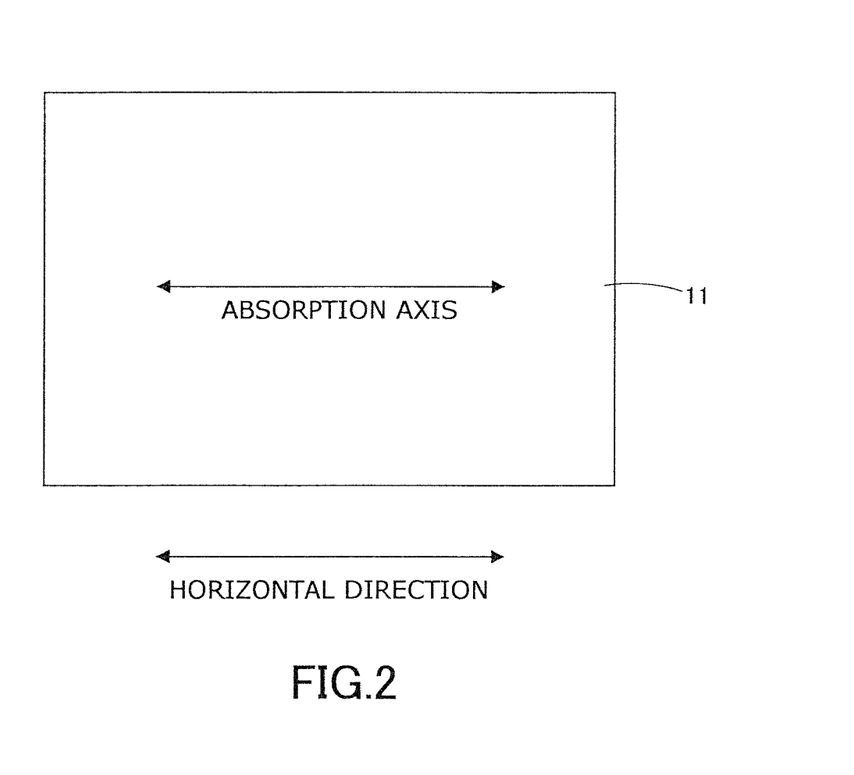
FIG. 2 is a plan view of a polarizer according to an embodiment.
Figure 3:
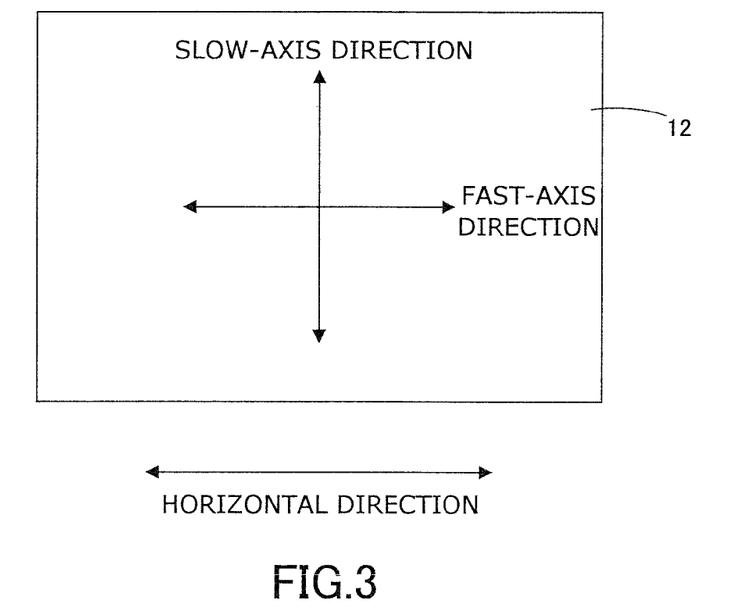
FIG. 3 is a plan view of a light transmissive film according to an embodiment.

A polarizing plate according to an embodiment of the present invention will be explained below with reference to the drawings. There is the longitudinal cross-sectional view of the polarizing plate according to the present embodiment, FIG. 2 is the plan view of the polarizer according to the present embodiment, and FIG. 3 is the plan view of the light transmissive film according to the present embodiment. As used herein, the terms "film", "sheet", "plate", and the like are based only on differences in names and not distinguished from each other. Accordingly, for example, "film" is a concept encompassing a member that can also be called a sheet or a plate. As one specific example, "optical film" also encompasses a member called "optical sheet", "optical plate", or the like.

"Polarizing Plate"

As illustrated in FIG. 1, a polarizing plate 10 includes a polarizer 11, a light transmissive film 12 disposed on one surface of the polarizer 11, and a functional layer 13 disposed on a plane opposite to the surface, on which the polarizer 11 is disposed, of the light transmissive film 12. It is essential only that the polarizing plate of the present invention includes a polarizer and a light transmissive film. The polarizing plate need not include a functional layer. The polarizing plate 10 can be used in an image display apparatus. When the polarizing plate 10 is used in the image display apparatus, it is preferable that the polarizing plate 10 is placed so that the light transmissive film 12 is located in a side closer to an observer than the polarizer 11, and it is preferable that the polarizing plate 10 is placed in a side closer to an observation side than a display element in the image display apparatus.

<Polarizer>

The polarizer 11 has an absorption axis. The polarizer 11 is placed so that the absorption-axis direction of the polarizer is along a horizontal direction as illustrated in FIG. 2. The phrase "absorption-axis direction of polarizer is along horizontal direction" means that the absorption-axis direction of the polarizer is in a range of less than ±10° with respect to the horizontal direction. The polarizer 11 is preferably placed so that the absorption-axis direction of the polarizer is in a range of less than ±5° with respect to the horizontal direction.

Examples of the polarizer 11 include polyvinyl alcohol films, polyvinyl formal films, polyvinyl acetal films, ethylene-vinyl acetate copolymer-based saponified films, and the like, dyed with iodine or the like and stretched.

<Light Transmissive Film>

The light transmissive film 12 functions as a protective film for protecting the polarizer 11. The light transmissive film 12 has birefringence in a plane. As to whether or not the light transmissive film has a birefringent property in a plane, it is determined that at a refractive index at a wavelength of 550 nm, a light transmissive film with $\Delta n(n_x - n_y) \geq 0.0005$ has a birefringent property while a light transmissive film with $\Delta n < 0.0005$ has no birefringent property. A birefringence can be measured, using KOBRA-WR manufactured by Oji Scientific Instruments Co., Ltd., at a measurement angle and a measurement wavelength set at 0° and 552.1 nm, respectively. In this case, birefringence calculation requires a film thickness and an average refractive index. The film thickness can be measured by, for example, a micrometer (DIGIMATIC MICROMETER, manufactured by Mitutoyo Corporation) or an electric micrometer (manufactured by ANRITSU CORPORATION). The average refractive index can be measured using an Abbe refractometer or an ellipsometer.

TD80UL-M (manufactured by FUJIFILM Corporation) comprising triacetylcellulose and ZF16-100 (manufactured by Zeon Corporation) comprising a cycloolefin polymer, which are generally known as an isotropic material, have $\Delta n$ of 0.0000375 and 0.00005, respectively, in the measurement method described above, and were considered to have no birefringent property (isotropy).

In addition, as a method for measuring birefringence, the orientation axis direction (direction of principal axis) of a light transmissive substrate can be determined using two polarizing plates to determine the refractive indices (nx and ny) of two axes orthogonal to the orientation axis direction with an Abbe refractometer (NAR-4T manufactured by ATAGO CO., LTD.); or a black vinyl tape (for example, YAMATO VINYL TAPE No. 200-38-21, 38 mm in width) is affixed to a back surface, 5-degree reflectances with a slow axis set in parallel and with a fast axis set in parallel with respect to S-polarized light are measured by polarimetry using S-polarized light with a spectrophotometer (V7100 type, automatic absolute reflectance measurement unit, VAR-7010, manufactured by JASCO Corporation), and the refractive indices ($n_x$ and $n_y$) in the slow axis and the fast axis at each wavelength can be calculated based on the following expression.

$$R(\%) = (1-n)^2/(1+n)^2$$

The light transmissive film 12 satisfies a relationship of the following expression (1):

$$n_x > N > n_y \tag{1}$$

where a refractive index in a slow-axis direction which is a direction with a greatest refractive index in a plane of the light transmissive film 12 is $n_x$, a refractive index in a fast-axis direction which is a direction orthogonal to the slow-axis direction in the plane is $n_y$, and an average refractive index of the light transmissive film is N.

The average refractive index N of the light transmissive film 12 is represented by the following expression (2).

$$N = (n_x + n_y + n_z)/3 \tag{2}$$

In the expression (2), $n_x$ is the refractive index in the slow-axis direction, $n_y$ is the refractive index in the fast-axis direction, and $n_z$ is a refractive index in the thickness direction of the light transmissive film.

In the light transmissive film 12, an NZ coefficient preferably satisfies the following expression (3).

$$NZ=(n_x-n_z)/(n_x-n_y)<2.0 \qquad (3)$$

In the expression (3), $n_x$ is the refractive index in the slow-axis direction, $n_y$ is the refractive index of the fast-axis direction, and $n_z$ is the refractive index in the thickness direction of the light transmissive film The light transmissive film 12 is placed so that the fast-axis direction of the light transmissive film 12 is along a horizontal direction, as illustrated in FIG. 3. In other words, the polarizing plate 10 is placed so that both fast-axis direction of the light transmissive film 12 and absorption-axis direction of the polarizer 11 are along the horizontal direction. Accordingly, the fast axis of the light transmissive film 12 is positioned with respect to both of the horizontal direction and the absorption axis of the polarizer 11. The phrase "fast-axis direction of light transmissive film is along horizontal direction" means that the fast-axis direction of the light transmissive film is in a range of less than ±10° with respect to the horizontal direction. In the present specification, when the light transmissive film is viewed from the front, a case in which the fast axis of the light transmissive film deviates clockwise with respect to the horizontal direction is regarded as a + direction while a case in which the fast axis of the light transmissive film deviates counterclockwise with respect to the horizontal direction is regarded as a – direction. The light transmissive film 12 is preferably placed so that the fast-axis direction of the light transmissive film is in a range of less than ±5° with respect to the horizontal direction.

The light transmissive film 12 may be disposed on one surface of the polarizer 11 and is preferably affixed to one surface of the polarizer 11.

In the light transmissive film 12, a difference Δn between the refractive index $n_x$ in the slow-axis direction of the light transmissive film 12 and the refractive index $n_y$ in the fast-axis direction which is a direction orthogonal to the slow-axis direction is preferably 0.01 or more and 0.30 or less. This is because when the refractive index difference Δn is less than 0.01, a reflectance difference in the case of arranging the slow axis and the fast axis in a horizontal direction becomes low, and the obtainable effect of improving bright-place contrast is reduced. In contrast, when the refractive index difference Δn is more than 0.30, an excessively increased stretching rate is needed, therefore, fissures, breaks, and the like are easily caused, and practicality as an industrial material may be markedly deteriorated. The lower limit of the refractive index difference Δn is preferably 0.05, more preferably 0.07. The preferred upper limit of the refractive index difference Δn is 0.27. When the refractive index difference Δn is more than 0.27, the durability of the light transmissive film 12 in a test for resistance to moist heat may be deteriorated depending on the kind of the light transmissive film 12. The more preferred upper limit of the refractive index difference Δn is 0.25 from the viewpoint of securing excellent durability in a test for resistance to moist heat.

The light transmissive film 12 is not particularly limited if it is a light transmissive film having a birefringent property in a plane and satisfying the expression (1) described above. Examples of such a light transmissive film include polyester films, polycarbonate films, cycloolefin polymer films, acrylic films, and the like. Of these, the polyester films and the polycarbonate films are preferred from the viewpoint of resulting in the high expression property of a refractive index difference Δn and easily obtaining the effect of improving bright-place contrast. Even among cellulose ester films, a cellulose ester film that is stretched to have a birefringent property in a plane can be used.

Examples of the polyester films include polyethylene terephthalate, polyethylene isophthalate, polybutylene terephthalate, poly(1,4-cyclohexylene dimethylene terephthalate), polyethylene naphthalate (polyethylene-2,6-naphthalate, polyethylene-1,4-naphthalate, polyethylene-1,5-naphthalate, polyethylene-2,7-naphthalate, or polyethylene-2,3-naphthalate), and the like.

The polyester used in such a polyester film may be a copolymer of the polyesters described above, or may be one prepared by blending such a polyester as described above as a main component (for example, a component of 80 mol % or more) and another kind of resin in a small rate (for example, 20 mol % or less). The polyester is particularly preferably polyethylene terephthalate (PET) or polyethylene-2,6-naphthalate (PEN) because of a good balance of properties such as dynamic physical properties and optical physical properties. The polyester is particularly preferably polyethylene terephthalate. Polyethylene terephthalate has high general-purpose properties, is readily available, and can enhance a birefringent property.

Examples of the polycarbonate films include aromatic polycarbonate films based on bisphenols (such as bisphenol A); aliphatic polycarbonate films based on diethylene glycol bis(allyl carbonate) and the like; and the like.

Examples of the cycloolefin polymer films include films comprising polymers of norbornene-based monomers, monocyclic cycloolefin monomers, and the like.

Examples of the acrylic films include poly(methyl (meth) acrylate) films, poly(ethyl (meth)acrylate) films, methyl (meth)acrylate-butyl (meth)acrylate copolymer films, and the like.

Examples of the cellulose ester films include cellulose triacetate films and cellulose diacetate films. The cellulose ester films are excellent in light transmissiveness. Of the cellulose acylate films, triacetylcellulose films (TAC films) are preferable. The triacetylcellulose films are light transmissive films of which the average light transmittances can be 50% or more in a visible light region of 380 to 780 nm. The average light transmittances of the triacetylcellulose films are 70% or more, further preferably 85% or more.

The triacetylcellulose films may be pure triacetylcellulose as well as combinations of cellulose and components other than acetic acid, as fatty acids that form esters, such as cellulose acetate propionate and cellulose acetate butyrate. Other lower fatty acid esters of cellulose, such as diacetyl cellulose, or various additives such as plasticizers, ultraviolet absorbing agents, and lubricants may be optionally added to these kinds of triacetylcellulose.

The thickness of the light transmissive film 12 is preferably in a range of 10 μm or more and 300 μm or less. When the thickness is less than 10 μm, anisotropy of dynamics properties is significant, fissures, breaks, and the like are easily caused, and practicality as an industrial material may be markedly deteriorated. In contrast, a case in which the thickness is more than 300 μm is not preferred since a light transmissive film is very rigid, flexibility peculiar to a polymeric film is deteriorated, and practicality as an industrial material is also deteriorated. The more preferred lower limit of the thickness of the light transmissive film described above is 20 μm, the more preferred upper limit of the thickness is 200 μm, and the further preferred upper limit of the thickness is 150 μm.

The light transmissive film 12 preferably has a transmittance in the visible light region of 80% or more, more preferably 84% or more. The transmittance described above can be measured in conformity with JIS K7361-1 (Plastics-Determination of the total luminous transmittance of transparent materials).

The light transmissive film may be subjected to surface treatment such as saponification treatment, glow discharge treatment, corona discharge treatment, ultraviolet (UV) treatment, or flame treatment without departing from the scope of the present invention.

The light transmissive film 12 is preferably obtained by stretching an unstretched light transmissive film only in a width direction or by slightly stretching the unstretched light transmissive film in a longitudinal direction and then stretching the unstretched light transmissive film in the width direction. The reason is as follows. A conventional light transmissive film is obtained by stretching an unstretched light transmissive film in a longitudinal direction and then stretching it in a width direction at a rate equal to that in the longitudinal direction. However, a bowing phenomenon easily occurs in the light transmissive film obtained by such a stretching method. In contrast, in the case of stretching a roll-shaped unstretched light transmissive film only in a width direction or of slightly stretching the film in a longitudinal direction and then stretching the film in the width direction, the occurrence of the bowing phenomenon can be inhibited, and therefore, a fast axis exists along the longitudinal direction in the stretched light transmissive film obtained in such a manner. On the other hand, since a roll-shaped polarizer is manufactured while controlling stretching treatment of the polarizer with very high precision, an absorption axis exists along a longitudinal direction except in special cases. Therefore, the polarizing plate in which the absorption-axis direction of the polarizer and the fast-axis method of the transmissive film are along each other can be formed by affixing the polarizer and the light transmissive film to each other by a roll-to-roll process.

<Functional Layer>

The functional layer 13 is disposed on the plane opposite to the plane, on which the polarizer 11 is disposed, of the light transmissive film 12, as described above. The functional layer 13 is a layer intended to exert any function. Specific examples of the layer include layers that exert one or more functions such as hard coat properties, antiglare properties, antireflection properties, antistatic properties, and antifouling properties. The refractive index of the functional layer 13 in a direction parallel to the fast-axis direction of the light transmissive film 12 is lower than that in the fast-axis direction of the light transmissive film 12. The light transmissive film is preferably placed so that the slow-axis direction of the light transmissive film is along a horizontal direction when a functional layer of which the refractive index in a direction parallel to the slow-axis direction of the light transmissive film is higher than the refractive index in the slow-axis direction of the light transmissive film is used.

One or more further functional layers may also be disposed on the side opposite to the side, on which the light transmissive film 12 is disposed, of the functional layer 13. Examples of the further functional layers include a layer that exerts one or more functions such as hard coat properties, antiglare properties, antireflection properties, antistatic properties, and antifouling properties, as in the case of the functional layer 13 mentioned above.

(Hard Coat Layer)

A hard coat layer is a layer that exerts hard coat properties, and specifically has a hardness of "H" or more on the pencil hardness test (load of 4.9 N) defined in JIS K5600-5-4 (1999).

The thickness of the hard coat layer is preferably 1.0 μm or more and 10.0 μm or less. When the thickness of the hard coat layer is within this range, desired hardness can be obtained. Further, while the hard coat layer can be thinned, the occurrence of cracking or curl of the hard coat layer can be suppressed. The thickness of the hard coat layer can be measured by sectioning microscopy. The lower limit of the thickness of the hard coat layer is more preferably 1.5 μm or more, and the upper limit thereof is more preferably 7.0 μm or less. The thickness of the hard coat layer is further preferably 2.0 μm or more and 5.0 μm or less.

The hard coat layer comprises, for example, at least a binder resin. The binder resin is obtained by polymerizing (crosslinking) a photopolymerizable compound by light irradiation. The photopolymerizable compound has at least one photopolymerizable functional group. As used herein, "photopolymerizable functional group" refers to a functional group which can be polymerized by light irradiation. Examples of the photopolymerizable functional group include a group having an ethylenic double bond, such as a (meth)acryloyl group, a vinyl group, or an allyl group. "(Meth)acryloyl group" means a group encompassing both of "acryloyl group" and "methacryloyl group". Examples of light irradiated when the photopolymerizable compound is polymerized include visible light rays and ionizing radiations such as ultraviolet rays, X-rays, electron rays, α-rays, β-rays, and γ-rays.

Examples of the photopolymerizable compound include photopolymerizable monomers, photopolymerizable oligomers, or photopolymerizable polymers, which may be appropriately adjusted to be used. As the photopolymerizable compound, a combination of a photopolymerizable monomer with a photopolymerizable oligomer or a photopolymerizable polymer is preferred.

Photopolymerizable Monomer

A photopolymerizable monomer has a weight average molecular weight of less than 1000. As the photopolymerizable monomer, a polyfunctional monomer having two (i.e., bifunctional) or more photopolymerizable functional groups is preferred. As used herein, "weight average molecular weight" is a value on a polystyrene basis, obtained by dissolution in a solvent such as tetrahydrofuran (THF) and by a gel permeation chromatography (GPC) method known in the art.

Examples of bi- or multi-functional monomers include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyester di(meth)acrylate, bisphenol di(meth)acrylate, diglycerol tetra(meth)acrylate, adamanthyl di(meth)acrylate, isobornyl di(meth)acrylate, dicyclopentane di(meth)acrylate, tricyclodecane di(meth)acrylate, and ditrimethylolpropane tetra(meth)acrylate, and monomers obtained by modifying them with PO, EO, and the like.

Among them, pentaerythritol triacrylate (PETA), dipentaerythritol hexaacrylate (DPHA), pentaerythritol tetraacrylate (PETTA), dipentaerythritol pentaacrylate (DPPA), and the like are preferred from the viewpoint of obtaining a hard coat layer having high hardness.

Photopolymerizable Oligomer

A photopolymerizable oligomer has a weight average molecular weight of 1000 or more and less than 10000. As such photopolymerizable oligomers, bi- or multi-functional polyfunctional oligomers are preferred. Examples of the polyfunctional oligomers include polyester (meth)acrylate, urethane (meth)acrylate, polyester-urethane (meth)acrylate, polyether (meth)acrylate, polyol (meth)acrylate, melamine (meth)acrylate, isocyanurate (meth)acrylate, epoxy (meth) acrylate, and the like.

Photopolymerizable Polymer

A photopolymerizable polymer has a weight average molecular weight of 10000 or more, and the weight average molecular weight is preferably 10000 or more and 80000 or less, more preferably 10000 or more and 40000 or less. When the weight average molecular weight is more than 80000, coating suitability might be deteriorated due to high viscosity to deteriorate the appearance of an obtained optical film. Examples of the above-described polyfunctional polymer include urethane (meth)acrylate, isocyanurate (meth) acrylate, polyester-urethane (meth)acrylate, epoxy (meth) acrylate, and the like.

In addition, a solvent drying type resin (such as a thermoplastic resin; such a resin as to become a coating only by drying a solvent added to adjust a solid content during coating) or a thermosetting resin may be optionally added to the hard coat layer.

In the case of adding the solvent drying type resin, any defect in a coating on a surface coated with a coating fluid can be effectively prevented when the hard coat layer is formed. As the solvent drying type resin, without particular limitation, a thermoplastic resin can be typically used. Examples of the thermoplastic resin may include styrenic resins, (meth)acrylic resins, vinyl acetate resins, vinyl ether resins, halogen-containing resins, alicyclic olefinic resins, polycarbonate resins, polyester resins, polyamide resins, cellulose derivatives, silicone resins, rubbers or elastomers, and the like.

Preferably, the thermoplastic resin is noncrystalline and is soluble in an organic solvent (particularly a common solvent in which a plurality of polymers or curable compounds can be dissolved). From the viewpoint of transparency and weather resistance, particularly preferred are styrenic resins, (meth)acrylic resins, alicyclic olefinic resins, polyester resins, cellulose derivatives (such as cellulose esters), and the like.

Examples of the thermosetting resin added to the hard coat layer include, but are not particularly limited to, phenol resins, urea resins, diallyl phthalate resins, melamine resins, guanamine resins, unsaturated polyester resins, polyurethane resins, epoxy resins, aminoalkyd resins, melamine-urea cocondensed resins, silicone resins, polysiloxane resins, and the like.

The hard coat layer can be formed by applying a composition for a hard coat layer comprising the photopolymerizable compound described above to the light transmissive film, drying it, and then irradiating the coating film-like composition for a hard coat layer with light such as ultraviolet light to polymerize (crosslink) the photopolymerizable compound.

In addition to the photopolymerizable compound described above, the thermoplastic resin described above, a thermosetting resin, a solvent, or a polymerization initiator may be optionally added to the composition for a hard coat layer. Further, a dispersing agent, a surfactant, an antistatic agent, a silane coupling agent, a thickener, a coloring inhibitor, a coloring agent (a pigment or a dye), an anti-foaming agent, a leveling agent, a flame retardant, an ultraviolet absorbing agent, an adhesion-imparting agent, a polymerization inhibitor, an oxidation inhibitor, a surface modifier, a lubricant, or the like, known in the art, may also be added to the composition for a hard coat layer depending on a purpose such as increase in the hardness of the hard coat layer, suppression of shrinkage on curing, or control of a refractive index.

Examples of methods for applying a composition for a hard coat layer include known application methods such as spin coating, dip methods, spray methods, slide coating methods, bar coating methods, roll coating methods, gravure coating methods, and die coating methods.

When ultraviolet light is used as light for curing a composition for a hard coat layer, there can be used ultraviolet light emitted from ultra-high-pressure mercury lamps, high-pressure mercury lamps, low-pressure mercury lamps, carbon-arc, xenon-arc and metal halide lamps, and the like. Further, a wavelength region of 190 to 380 nm may be used for the wavelength of the ultraviolet light. Specific examples of electron beam sources include various electron beam accelerators such as Cockcroft-Walton accelerators, Van de Graaff accelerators, resonance transformer accelerators, insulated core transformer accelerators, linear accelerators, Dynamitron accelerators, and high-frequency accelerators.

(Antiglare Layer)

An antiglare layer is a layer that exerts antiglare properties. A surface of the antiglare layer is a concavo-convex surface. Diffuse reflection of extraneous light can be achieved by allowing the surface of the antiglare layer to be the concavo-convex surface. In addition, "surface of antiglare layer" means the plane opposite to the plane (back surface), closer to the light transmissive film, of the antiglare layer. The antiglare layer can be formed by incorporating organic fine particles or inorganic fine particles for forming a concavo-convex surface into the above-described composition for a hard coat layer.

(Antistatic Layer)

An antistatic layer is layer that exerts antistatic properties. The antistatic layer can be formed by incorporating an antistatic agent into the above-described composition for a hard coat layer. As the antistatic agent described above, an antistatic agent known in the art can be used, and, for example, a cationic antistatic agent such as a quaternary ammonium salt, fine particles such as tin-doped indium oxide (ITO), a conductive polymer, or the like can be used. When the antistatic agent described above is used, the content of the antistatic agent is preferably 1 to 30 mass % with respect to the total mass of the total solid thereof.

(Antifouling Layer)

An antifouling layer is a layer that exerts antifouling properties and specifically a layer that plays a role in which fouling (fingerprints, water- or oil-based inks, pencils, and the like) is inhibited from adhering to the outermost surface of an image display apparatus or can be easily wiped off when adhering to it. Antifouling properties and scratch resistance for a liquid crystal display apparatus can be improved by forming the antifouling layer described above. The antifouling layer can be formed by, for example, a composition comprising an antifouling agent and a resin.

The antifoulant described above is for the main purpose of preventing fouling on the outermost surface of an image display apparatus and can also impart a liquid crystal display apparatus with scratch resistance. Examples of the antifouling agent described above include fluorine-based compounds, silicon-based compounds, or mixed compounds thereof. More specific examples of the antifouling agent include silane coupling agents having a fluoroalkyl group such as 2-perfluorooctylethyltriaminosilane. In particular, a silane coupling agent having an amino group can be preferably used.

The antifouling layer is particularly preferably formed to be an outermost surface. The antifouling layer can be replaced by, for example, the hard coat layer in itself imparted with antifouling performance.

It is preferable to form a low-refractive-index layer on the hard coat layer and the antiglare layer.

(Low-Refractive-Index Layer)

The low-refractive-index layer is intended to reduce the reflectance of the surface of the polarizing plate when light from the outside (for example, a fluorescent lamp, natural light, or the like) is reflected by the surface of the polarizing plate. The low-refractive-index layer has a refractive index that is lower than that of the hard coat layer or the antiglare layer. Specifically, for example, the low-refractive-index layer preferably has a refractive index of 1.45 or less and more preferably has a refractive index of 1.42 or less.

The thickness of the low-refractive-index layer is not limited but may be appropriately set within a range of, typically, around 30 nm to 1 μm. The thickness $d_A$ (nm) of the low-refractive-index layer preferably satisfies the following expression (4).

$$d_A = m\lambda/(4n_A) \qquad (4)$$

In the expression described above, $n_A$ represents the refractive index of the low-refractive-index layer, m represents a positive odd number and is preferably 1, and λ is a wavelength which is preferably a value in a range of 480 nm or more and 580 nm or less.

From the viewpoint of reducing a reflectance, the low-refractive-index layer preferably satisfies the following expression (5).

$$120 < n_A d_A < 145 \qquad (5)$$

A single low-refractive-index layer provides an effect, and it is also possible to appropriately dispose two or more low-refractive-index layers for the purpose of adjusting a lower minimum reflectance or a higher minimum reflectance. When the two or more low-refractive-index layers are disposed, it is preferable to vary the refractive index and thickness of each low-refractive-index layer.

The low-refractive-index layer can preferably include any of: 1) resin containing low-refractive-index particles such as silica or magnesium fluoride; 2) fluorinated resin which is a low-refractive-index resin; 3) fluorinated resin containing silica or magnesium fluoride; 4) a thin film of a low-refractive-index substance such as silica or magnesium fluoride; and the like. As the resin other than the fluorinated resins, a resin similar to the binder resin included in the hard coat layer mentioned above can be used.

The silica is preferably hollow silica particles. Such hollow silica particles can be produced by, for example, the production method described in examples of Japanese Patent Laid-Open No. 2005-099778.

<Improvement of Bright-Place Contrast by Polarizing Plate>

In the present embodiment, the light transmissive film 12 satisfies the expression (1) described above, and the polarizer 11 and the light transmissive film 12 are placed so that both absorption-axis direction of the polarizer and fast-axis direction of the light transmissive film are along the horizontal direction. The present inventors confirmed that bright-place contrast was able to be effectively enhanced to such a degree as to be able to sense a degree of improvement in visual observation by using the polarizing plate 10 as a polarizing plate located in an observer side for a display apparatus, so-called an upper polarizing plate. Although the detailed reason that such a phenomenon occurs is unknown, the following can be regarded as one cause. However, the present invention is not bound by the following estimation.

First, bright-place contrast is calculated as {(luminance in white display+reflection of extraneous light)/(luminance in black display+reflection of extraneous light)}. The higher the obtained contrast value is, the superior the contrast is. Accordingly, the bright-place contrast can be improved when the reflection of extraneous light on the surface of the light transmissive film 12 can be reduced. On the other hand, it is expected that each layer included in the polarizing plate expresses various functions. As a matter of course, a material used in each layer and the setting of the refractive index of each layer depending on the material are restricted. Therefore, a refractive index difference between the light transmissive film 12 and the functional layer 13 is inevitably generated except in special cases. Unlike the illustrated form, it is presumed that a layer such as the functional layer 13 is not disposed in the observer side for the light transmissive film 12. However, even in this case, a refractive index interface causing reflection is generated between air and the light transmissive film 12. The refractive index difference causes reflection of extraneous light on the interface between the light transmissive film 12 and the functional layer 13 and has been one cause of the deterioration of the bright-place contrast in a display apparatus.

On the other hand, there are P-polarized light and S-polarized light as the polarized components of light that is incident on a display apparatus and can cause bright-place contrast. In addition, the reflectance of P-polarized light is lower than the reflectance of S-polarized light. Besides, a Brewster's angle in which the reflectance is 0% exists in P polarized light. Therefore, light that is reflected by a floor surface or a ceiling surface and is incident on the image display surface of an image display apparatus necessarily unbalancedly includes a polarized component (S-polarized light) that oscillates in a horizontal direction. Judging from the above, even when average refractive indices depending on a material used are different between the light transmissive film 12 and the functional layer 13, the reflection of extraneous light between the light transmissive film 12 and the functional layer 13, causing the deterioration of the bright-place contrast, can be effectively prevented only by allowing the in-plane refractive index of the light transmissive film 12 along the horizontal direction to approach the in-plane refractive index of the functional layer 13 along the horizontal direction.

Thus, in the polarizing plate 10 of the present embodiment, a refractive index difference between the light transmissive film 12 and the functional layer 13 in the horizontal direction, influencing the reflectance of a polarized component oscillating in a horizontal direction, is minimized by using the light transmissive film 12 with birefringence while permitting the difference between the average refractive indices of the light transmissive film 12 and the functional layer 13, which can be necessarily caused by the constraint of material selection, and by further daringly applying birefringence even to the light transmissive film 12 comprising a material considered to typically have optical isotropy. More specifically, since the average refractive index of the light transmissive film 12 is typically higher than the average refractive index of the functional layer 13, the fast-axis direction with the lowest refractive index of the in-plane refractive indices of the light transmissive film 12 is allowed to be along the horizontal direction to reduce the refractive index difference between the light transmissive film 12 and functional layer 13 in the horizontal direction. The refractive index difference in the horizontal direction in the interface between the light transmissive film 12 and the functional layer 13 is reduced to effectively reduce the reflection of the polarized component oscillating in the horizontal direction on the interface between the light transmissive film 12 and the functional layer 13 as a main cause that results in the deterioration of the bright-place contrast while permitting the refractive index difference between the average refractive indices of the light transmissive film 12 and the functional layer 13 and securing the degree of the freedom of the selection of a material used in the light transmissive film 12 and the functional layer 13 by allowing the direction of the fast axis of the light transmissive film 12 included in the polarizing plate 10 to be along the horizontal direction in such a manner. In the absence of the functional layer 13, the light transmissive substrate 12 comes into contact with air, and therefore, the refractive index difference between the light transmissive substrate 12 and air can be reduced by allowing the fast-axis direction with the lowest refractive index of the in-plane refractive indices of the light transmissive film 12 to be along the horizontal direction. As a result, the reflection of the polarized component oscillating in the horizontal direction as a main cause that results in the deterioration of the bright-place contrast can be effectively reduced in a manner similar to the above.

Furthermore, the reflection of the polarized component (S-polarized light), of which a high proportion is incident on the image display surface and which oscillates in the horizontal direction, on the light transmissive film 12 can be reduced. As a result, however, most of the polarized component oscillating in the horizontal direction passes through the light transmissive film 12. Typically, a polarized component that passes through a light transmissive film and oscillates in a horizontal direction is absorbed in an image display apparatus or becomes stray light which returns to an observer side. The stray light that returns to the observer side causes a brightness distribution different from that of a display image and therefore becomes one cause of reducing bright-place contrast. In this regard, in the present embodiment, the polarized component that passes through the light transmissive film 12 and oscillates in the horizontal direction can be absorbed by the polarizer 11 since the polarizer 11 is placed so that the absorption axis of the polarizer 11 is along the horizontal direction. As a result, the light amount of the horizontally oscillating polarized component that passes through the light transmissive film 12 and then returns to the observer side can be reduced. Stray light can be effectively prevented from being generated to improve bright-place contrast by allowing the direction of the fast axis of the light transmissive film 12 included in the polarizing plate 10 and the direction of the absorption axis of polarizer 11 to be along each other in such a manner.

According to the present embodiment, in such a manner as described above, the reflection of the horizontally oscillating polarized component (S-polarized light) on the surface of the light transmissive film 12 can be reduced, and therefore, bright-place contrast can be effectively improved. Furthermore, deterioration of image quality can be suppressed to further improve bright-place contrast since stray light that is the horizontally oscillating polarized component (S-polarized light) passing through the light transmissive film and returns to the observer side can be absorbed by the polarizer.

When an observer observes a display image on a liquid crystal display apparatus over polarizing sunglasses, there is a fear that visibility is deteriorated depending on an angle between the absorption axis of the polarizer in the observer side of the liquid crystal display apparatus and the absorption axis of the polarizing sunglasses. In other words, when the observer wearing the polarizing sunglasses views the display image in the liquid crystal display apparatus in which the absorption-axis direction of the polarizer is the horizontal direction, in, e.g., a VA mode or an IPS mode, in the posture of normally often observing display images (in the posture in which the absorption-axis direction of the polarizing sunglasses is an approximately horizontal direction), the absorption-axis direction of the polarizing sunglasses and the absorption-axis direction of the polarizer are in a parallel nicol state, and therefore, visibility is not deteriorated. However, when the observer tilts his/her head to a crosswise direction or when the observer lies, the polarizing sunglasses and the polarizing plate are not in a parallel nicol state. In particular, when the observer views a display image in a state in which the absorption axis of the polarizing sunglasses is in an approximately vertical direction, the polarizing sunglasses and the polarizing plate are in a crossed nicol state, and therefore, there is a fear that visibility is markedly deteriorated. In order to improve the problem of the deterioration of visibility, a light transmissive film having a birefringent property in a plane such as a λ/4 phase difference film is currently known to be placed in a side closer to an observer than a polarizer in the observer side of a liquid crystal display apparatus so that an angle between the absorption axis of the polarizer and the slow axis of the light transmissive film is 45°. This is based on the following theory.

Assuming that an angle between the absorption axis of a polarizer and the slow axis of a light transmissive film having a birefringent property in a plane is θ, the intensity of transmitted light observed under a crossed nicol is represented by the following expression (6).

$$I = I_0 \cdot \sin^2(2\theta) \cdot \sin^2(\pi \cdot Re/\lambda) \tag{6}$$

In the expression (6) described above, I is the intensity of light passing through a crossed nicol, $I_0$ is the intensity of light incident on the light transmissive film having a birefringent property in a plane, λ is the wavelength of light, and Re is the retardation of the light transmissive film.

In the expression (6), $\sin^2(2\theta)$ is a value of 0 to 1 depending on a value of θ, and therefore, $\sin^2(2\theta)=1$, i.e., θ=45° may be required for increasing I. Thus, in order to improve visibility in a case in which an observer observes a display image over polarizing sunglasses, the polarizer and the light transmissive film are placed so that an angle between the absorption axis of the polarizer and the slow axis of the light transmissive film having a birefringent property in a plane is 45°. However, this technique is a technique for improving visibility in a case in which the observer observes a display image over the polarizing sunglasses but is not a technique for improving bright-place contrast.

"Image Display Apparatus and Method for Improving Bright-Place Contrast in Image Display Apparatus"

Figure 4:
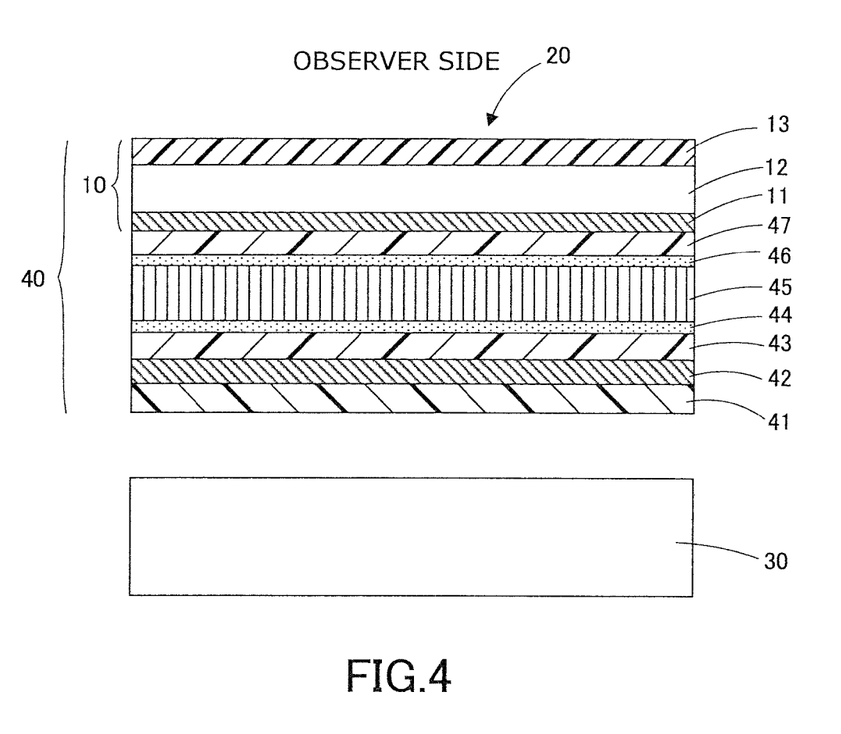
FIG. 4 is a schematic view illustrating the configuration of a liquid crystal display which is an example of an image display apparatus according to an embodiment.

The polarizing plate 20, incorporated into an image display apparatus, can be used. Examples of the image display apparatus include liquid crystal displays (LCDs), cathode ray tube displays (CRTs), plasma displays (PDPs), electroluminescence displays (ELDs), field emission displays (FEDs), touch panels, tablet PCs, electronic papers, and the like. FIG. 4 is a schematic view illustrating the configuration of a liquid crystal display which is an example of the image display apparatus into which the optical film according to the present embodiment is incorporated.

An image display apparatus 20 illustrated in FIG. 4 is a liquid crystal display. The image display apparatus 20 includes: a backlight unit 30; and a liquid crystal panel 40 including a polarizing plate 10 placed in a side closer to an observer than the backlight unit 30.

The backlight unit 30 is preferably a backlight unit including a white light emitting diode (white LED) as a backlight source. The white LED described above is an element emitting a white color in a fluorescent body mode, i.e., by combining a fluorescent body with a light emitting diode emitting blue light or ultraviolet light in which a compound semiconductor is used. Especially, a white light emitting diode including a light-emitting element in which a blue light emitting diode in which a compound semiconductor is used is combined with a yttrium-aluminum-garnet-based yellow fluorescent body has a continuous, wide emission spectrum, is therefore effective for improving bright-place contrast and excellent in luminous efficiency, and is therefore preferable as the above-described backlight source in the present invention. Since it is possible to broadly use white LEDs with small power consumption, the effect of reducing energy consumption can also be produced.

The liquid crystal panel 40 illustrated in FIG. 4 has a structure in which a protective film 41 such as a triacetyl-cellulose film (TAC film), a polarizer 42, a phase difference film 43, an adhesive layer 44, a liquid crystal cell 45, an adhesive layer 46, a phase difference film 47, and a polarizing plate 10 are layered in the order mentioned from a backlight unit 30 side to an observer side. In the liquid crystal cell 45, a liquid crystal layer, an oriented film, an electrode layer, a color filter, and the like are placed between two glass substrates. The liquid crystal cell 45 is used as a display element since the image display apparatus 20 is a liquid crystal display. However, the display element is not limited to the liquid crystal cell.

The polarizing plate 10 is placed in the image display apparatus 20 so that both absorption-axis direction of the polarizer 11 and fast-axis direction of the light transmissive film 12 are along a horizontal direction.

The image display apparatus 20 is preferably a VA-mode or IPS-mode liquid crystal display apparatus. The VA (vertical alignment) mode described above is an operation mode in which liquid crystal molecules are oriented to be perpendicular to the substrate of the liquid crystal cell with application of no voltage to show a dark display whereas liquid crystal molecules are tilted with application of a voltage to show a light display. The IPS (in-plane switching) mode is a mode in which a liquid crystal is rotated in a substrate surface to show a display by a transverse electric field applied to a comb-shaped electrode pair disposed on one substrate of the liquid crystal cell.

The reason why the VA-mode or IPS-mode image display apparatus is preferred is that the absorption axis of the polarizer disposed in a side closer to an observer than the liquid crystal cell is along the horizontal direction in the VA mode or the IPS mode.

The image display apparatus may be an organic electroluminescence display (organic EL display) in which the absorption axis of a polarizer is disposed in a horizontal direction. The organic EL display does not require a polarizer on the basis of the principle of image display. However, in the organic EL display, a structure in which a polarizer, a λ/4 phase difference plate, and an organic EL are layered in the order mentioned from an observer side may be used from the viewpoint of preventing reflection of extraneous light. The polarizer and the λ/4 phase difference plate function as circularly polarizing plates for preventing reflection of extraneous light. However, an ordinary λ/4 phase difference plate functions as a λ/4 phase difference plate only for specific wavelengths and is therefore incapable of preventing the reflection of the entire incident extraneous light. Accordingly, light that returns to the observer side can be reduced by absorbing S-polarized light to reduce light incident into the display with the absorption axis of the polarizer in the horizontal direction. Examples of image display modes for the organic EL display include: a color filter mode in which a white light-emitting layer is used and light is allowed to pass through a color filter to thereby achieve color display; a color conversion mode in which a blue light-emitting layer is used and part of light emitted from the layer is allowed to pass through a color-conversion layer to thereby achieve color display; a three-color mode in which red, green, and blue light-emitting layers are used; a mode in combination of the three-color mode with a color filter; and the like. The material of each light-emitting layer may be a low-molecular-weight molecule or may be a high-molecular-weight molecule.

EXAMPLES

The present invention will be explained below with reference to examples in order to explain the present invention in detail. However, the present invention is not limited to the description thereof.

<Bright-Place Contrast>

Bright-place contrast was evaluated in each polarizing plate obtained in examples and comparative examples, as described below. The evaluation of the bright-place contrast was performed in such a manner as described below. Each polarizing plate according to the examples and the comparative examples was placed in change of a polarizing plate of a liquid crystal monitor (FLATORON IPS226V (manufactured by LG Electronics Japan)) placed in the observer side so that the absorption-axis direction of a polarizer is a horizontal direction, and 15 subjects observed black display from the position apart from each liquid crystal monitor with the black display by around 50 to 60 cm at an ambient illuminance of 400 lux (bright place) to evaluate bright-place contrast by sensory evaluation. A liquid crystal monitor regarded as being the blackest by a large number of subjects was considered to have excellent bright-place contrast is superior whereas a liquid crystal monitor regarded as being blacker by a small number of subjects was evaluated as poor.

Bright-place contrast:CR=LW/LB

Bright-place white luminance (LW): luminance of white display on display apparatus in bright place with extraneous light (ambient illuminance of 400 lux)

Bright-place black luminance (LB): luminance of black display on display apparatus in bright place with extraneous light (ambient illuminance of 400 lux)

<Reflectance>

A reflectance was measured in each polarizing plate obtained in the examples and the comparative examples, as described below. The measurement of the reflectance was performed in such a manner as described below. A black vinyl tape (YAMATO VINYL TAPE No 200-38-21, 38 mm width) was attached onto the side, opposite to the light transmissive film, of the polarizing plate. Then, the 5-degree reflectance was measured in a case in which the absorption axis of the polarizer was placed in parallel with S-polarized light using a spectrophotometer (V7100 type, automatic absolute reflectance measurement unit VAR-7010, manufactured by JASCO Corporation).

Example 1, Comparative Example 1, and Comparative Example 2

A polyethylene naphthalate material was molten at 290° C. and was passed through a film-forming die to be extruded in a sheet shape. The sheet was attached onto a water-cooled rotating quench drum and cooled down to produce an unstretched film. The unstretched film has Δn=0.0004 and an average refractive index of N=1.63. The unstretched film was preheated for 1 minute at 120° C., then stretched at a stretching rate of 1.1 times at 120° C., and then stretched at a stretching rate of 4.0 times in the direction orthogonal to the direction of the stretching with a biaxial stretching testing apparatus (manufactured by Toyo Seiki Seisaku-sho, Ltd.) to obtain a light transmissive film of $n_x$=1.82, $n_y$=1.60, and $(n_x-n_y)$=0.22.

(Production of Polarizer)

A polyvinyl alcohol film having an average polymerization degree of about 2400, a saponification degree of 99.9 mol % or more, and a thickness of 75 μm was immersed in pure water at 30° C. and then immersed in an aqueous solution having an iodine/potassium iodide/water weight ratio of 0.02/2/100 at 30° C. Then, the film was immersed in an aqueous solution having a potassium iodide/boric acid/water weight ratio of 12/5/100 at 56.5° C. Subsequently, the film was washed with pure water at 8° C. and then dried at 65° C. to obtain a polarizer in which iodine was adsorbed and oriented in polyvinyl alcohol. The stretching was mainly performed in steps for iodine dyeing and treatment with boric acid, and the total stretching rate was 5.3 times.

The light transmissive film was adhesively affixed to one surface side of the obtained polarizer through a solventless, actinic-radiation-curable adhesive containing a cycloaliphatic epoxy compound so that the angle between the absorption axis of the polarizer and the fast axis of the light transmissive film was zero degree. Then, TD80UL-M (manufactured by FUJIFILM Corporation) B which was an isotropic film was adhesively affixed to the side, opposite to the side on which the light transmissive film was layered, of the polarizer through a solventless, actinic-radiation-curable adhesive containing a cycloaliphatic epoxy compound to produce a polarizing plate according to Example 1.

In Comparative Example 1, a polarizing plate was produced by a method similar to that of Example 1 except that a polarizer and a light transmissive film were adhesively affixed to each other so that the angle between the absorption axis of the polarizer and the fast axis of the light transmissive film was 90 degrees.

In Comparative Example 2, a polarizing plate was produced by a method similar to that of Example 1 except that the unstretched film produced in Example 1 was used.

Measurement of the reflectances of the polarizing plates according to Example 1, Comparative Example 1, and Comparative Example 2 revealed that they were 5.32%, 8.45%, and 5.74%, respectively. The polarizing plate according to Example 1 was excellent in anti-reflection performance. In addition, evaluation of the bright-place contrasts of liquid crystal monitors, in which Example 1, Comparative Example 1, and Comparative Example 2 were used, by visual observation revealed that the liquid crystal monitor in which the polarizing plate of Example 1 was used was superior in bright-place contrast to the liquid crystal monitors in which the polarizing plates of Comparative Example 1 and Comparative Example 2 were used.

Example 2, Comparative Example 3, and Comparative Example 4

A polyethylene naphthalate material was molten at 290° C. and was passed through a film-forming die to be extruded in a sheet shape. The sheet was attached onto a water-cooled rotating quench drum and cooled down to produce an unstretched film. The unstretched film has Δn=0.00035 and an average refractive index of N=1.61. The unstretched film was preheated for 1 minute at 120° C. and then stretched at a stretching rate of 4.5 times at 120° C. with a biaxial stretching testing apparatus (manufactured by Toyo Seiki Seisaku-sho, Ltd.) to obtain a light transmissive film of $n_x$=1.70, $n_y$=1.57, and $(n_x-n_y)$=0.13. In Example 2, a polarizing plate was produced by a method similar to that of Example 1 except that the light transmissive film was used.

In Comparative Example 3, a polarizing plate was produced by a method similar to that of Example 1 using the light transmissive film produced in Example 2 except that a polarizer and a light transmissive film were adhesively affixed to each other so that the angle between the absorption axis of the polarizer and the fast axis of the light transmissive film was 90 degrees.

In Comparative Example 4, a polarizing plate was produced by a method similar to that of Example 1 using the unstretched film produced in Example 2.

Measurement of the reflectances of the polarizing plates according to Example 2, Comparative Example 3, and Comparative Example 4 revealed that they were 4.92%, 6.72%, and 5.46, respectively. The polarizing plate according to Example 2 was excellent in anti-reflection performance. In addition, evaluation of the bright-place contrasts of liquid crystal monitors, in which Example 2, Comparative Example 3, and Comparative Example 4 were used, by visual observation revealed that the liquid crystal monitor in which the polarizing plate of Example 2 was used was superior in bright-place contrast to the liquid crystal monitors in which the polarizing plates of Comparative Example 3 and Comparative Example 4 were used.

Example 3, Comparative Example 5, and Comparative Example 6

Cellulose acetate propionate (CAP504-0.2, manufactured by Eastman Chemical Company) was dissolved in methylene chloride as a solvent to have a solid concentration of 15%, then cast on glass, and dried. The unstretched film has Δn=0.00007 and an average refractive index of N=1.489. The obtained film was stretched at 2.0 times at 150° C. to obtain a light transmissive film of $n_x$=1.493, $n_y$=1.487, and $(n_x-n_y)$=0.006. In Example 3, a polarizing plate was produced by a method similar to that of Example 1 except that this light transmissive film was used.

In Comparative Example 5, a polarizing plate was produced by a method similar to that of Example 1 using the light transmissive film produced in Example 3 except that a polarizer and a light transmissive film were adhesively affixed to each other so that the angle between the absorption axis of the polarizer and the fast axis of the light transmissive film was 90 degrees.

In Comparative Example 6, a polarizing plate was produced by a method similar to that of Example 1 using the unstretched film produced in Example 3.

Measurement of the reflectances of the polarizing plates according to Example 3, Comparative Example 5, and Comparative Example 6 revealed that they were 3.81%, 3.92%, and 3.85, respectively. The polarizing plate according to Example 3 was excellent in anti-reflection performance. In addition, evaluation of the bright-place contrasts of liquid crystal monitors, in which Example 3, Comparative Example 5, and Comparative Example 6 were used, by visual observation revealed that the liquid crystal monitor in which the polarizing plate of Example 3 was used was superior in bright-place contrast to the liquid crystal monitor in which the polarizing plate of Comparative Example 5 was used. In addition, the liquid crystal monitor in which the polarizing plate of Example 3 was used was slightly superior in bright-place contrast to the liquid crystal monitor in which the polarizing plate of Comparative Example 6 was used.

Example 4, Comparative Example 7, Comparative Example 8

A composition for a hard coat layer, obtained by dissolving pentaerythritol triacrylate (PETA) in an MIBK solvent at 30 mass % and adding a photopolymerization initiator (Irg 184, manufactured by BASF) at 5 mass % with respect to a solid, was applied to one surface of the light transmissive film produced in Example 2 by a bar coater so as to have a film thickness of 5 μm after drying the composition, thereby forming a coating film. A polarizing plate according to Example 4 was produced by a method similar to that of Example 1 except after the formation of the coating film, the coating film was heated at 70° C. for 1 minute to remove the solvent, a coating surface was irradiated with ultraviolet rays to thereby cure the surface and to form a hard coat layer having a refractive index ($n_f$) of 1.53 on the light transmissive film, and a side opposite to a side with the hard coat layer was allowed to be a polarizer side.

In Comparative Example 7, a polarizing plate was produced by a method similar to that of Example 1 using the light transmissive film produced in Example 2 except that a hard coat layer was formed by a method similar to that of Example 4 and that a polarizer and a light transmissive film were adhesively affixed to each other so that the angle between the absorption axis of the polarizer and the fast axis of the light transmissive film was 90 degrees.

In Comparative Example 8, a polarizing plate was produced by a method similar to that of Example 1 using the unstretched film produced in Example 2 except that a hard coat layer was formed by a method similar to that of Example 4.

Measurement of the reflectances of the polarizing plates according to Example 4, Comparative Example 7, and Comparative Example 8 revealed that they were 4.40%, 4.65%, and 4.47%, respectively. The polarizing plate according to Example 4 was excellent in anti-reflection performance. In addition, evaluation of the bright-place contrasts of liquid crystal monitors, in which Example 4, Comparative Example 7, and Comparative Example 8 were used, by visual observation revealed that the liquid crystal monitor in which the polarizing plate of Example 4 was used was superior in bright-place contrast to the liquid crystal monitor in which the polarizing plate of Comparative Example 7 was used. In addition, the liquid crystal monitor in which the polarizing plate of Example 4 was used was slightly superior in bright-place contrast to the liquid crystal monitor in which the polarizing plate of Comparative Example 8 was used.

Example 5 and Comparative Example 9

The unstretched film produced in Example 2 was preheated for 1 minute at 120° C., then stretched at a stretching rate of 2.0 times at 120° C., and then stretched at a stretching rate of 4.0 times in the direction orthogonal to the direction of the stretching with a biaxial stretching testing apparatus (manufactured by Toyo Seiki Seisaku-sho, Ltd.) to obtain a light transmissive film of $n_x$=1.66, $n_y$=1.605, and $(n_x-n_y)$=0.055. A polarizing plate was produced by a method similar to Example 1 using the light transmissive film except that a hard coat layer was formed by a method similar to that of Example 4.

In Comparative Example 9, a polarizing plate was produced by a method similar to that of Example 1 using the light transmissive film produced in Example 5 except that a hard coat layer was formed by a method similar to that of Example 4 and that the angle between the absorption axis of a polarizer and the fast axis of the light transmissive film was 90 degrees.

Measurement of the reflectances of the polarizing plates according to Example 5 and Comparative Example 9 revealed that they were 4.42% and 4.55%, respectively. The polarizing plate according to Example 5 was excellent in anti-reflection performance compared to a reflectance of 4.47 of the polarizing plate according to Comparative Example 8. In addition, evaluation of the bright-place contrasts of liquid crystal monitors, in which Example 5, Comparative Example 9, and Comparative Example 8 were used, by visual observation revealed that the liquid crystal monitor in which the polarizing plate of Example 5 was used was superior in bright-place contrast to the liquid crystal monitor in which the polarizing plate of Comparative Example 9 was used. In addition, the liquid crystal monitor in which the polarizing plate of Example 5 was used was slightly superior in bright-place contrast to the liquid crystal monitor in which the polarizing plate of Comparative Example 8 was used.

Example 6, Example 7, and Comparative Example 10

In Example 6, a polarizing plate was produced by a method similar to that of Example 1 using the light transmissive film obtained in Example 2 except that a hard coat layer was formed by a method similar to that of Example 4 and that a polarizer and a light transmissive film were adhesively affixed to each other so that the angle between the absorption axis of the polarizer and the fast axis of the light transmissive film was +5 degrees.

In Example 7, a polarizing plate was produced by a method similar to that of Example 1 using the light transmissive film produced in Example 2 except that a hard coat layer was formed by a method similar to that of Example 4 and that a polarizer and a light transmissive film were adhesively affixed to each other so that the angle between the absorption axis of the polarizer and the fast axis of the light transmissive film was +10 degrees. In Comparative Example 10, a polarizing plate was produced by a method similar to that of Example 1 using the light transmissive film produced in Example 2 except that a hard coat layer was formed by a method similar to that of Example 4 and that a polarizer and a light transmissive film were adhesively affixed to each other so that the angle between the absorption axis of the polarizer and the fast axis of the light transmissive film was +45 degrees.

Measurement of the reflectances of the polarizing plates according to Example 6, Example 7, and Comparative Example 10 revealed that they were 4.41%, 4.45%, and 4.76%, respectively. The polarizing plates according to Example 6 and Example 7 were excellent in anti-reflection performance compared to a reflectance of 4.47 of the polarizing plate according to Comparative Example 8, whereas the polarizing plate according to Comparative Example 10 was inferior in anti-reflection performance to that of Comparative Example 8. In addition, evaluation of the bright-place contrasts of liquid crystal monitors, in which Example 6, Example 7, Comparative Example 10, and Comparative Example 8 were used, by visual observation revealed that the liquid crystal monitors in which the polarizing plates of Example 6 and Example 7 were used were slightly superior in bright-place contrast to the liquid crystal monitor in which the polarizing plate of Comparative Example 8 was used. In contrast, the liquid crystal monitor in which the polarizing plate of Comparative Example 10 was used was inferior in bright-place contrast to the liquid crystal monitor in which the polarizing plate of Comparative Example 8 was used. As for the polarizing plate of Example 6, a case in which a polarizer and a light transmissive film were adhesively affixed to each other so that the angle between the absorption axis of the polarizer and the fast axis of the light transmissive film was −5 degree also caused results similar to those of Example 6. As for the polarizing plate of Example 7, a case in which a polarizer and a light transmissive film were adhesively affixed to each other so that the angle between the absorption axis of the polarizer and the fast axis of the light transmissive film was −10 degree also caused results similar to those of Example 7. As for the polarizing plate of Comparative Example 10, a case in which a polarizer and a light transmissive film were adhesively affixed to each other so that the angle between the absorption axis of the polarizer and the fast axis of the light transmissive film was −45 degree also caused results similar to those of Comparative Example 10.

Comparative Example 11 and Comparative Example 12

The unstretched film produced in Example 2 was preheated for 1 minute at 120° C., then stretched at a stretching rate of 3.0 times at 120° C., and then stretched at a stretching rate of 4.0 times in the direction orthogonal to the direction of the stretching with a biaxial stretching testing apparatus (manufactured by Toyo Seiki Seisaku-sho, Ltd.) to obtain a light transmissive film of $n_x=1.65$, $n_y=1.62$, and $(n_x-n_y)=0.03$. In Comparative Example 11, a polarizing plate was produced by a method similar to Example 1 using the light transmissive film except that a hard coat layer was formed by a method similar to that of Example 4.

In Comparative Example 12, a polarizing plate was produced by a method similar to that of Example 1 using the light transmissive film produced in Comparative Example 11 except that a hard coat layer was formed by a method similar to that of Example 4 and that a polarizer and a light transmissive film were adhesively affixed to each other so that the angle between the absorption axis of the polarizer and the fast axis of the light transmissive film was 90 degrees.

Measurement of the reflectances of the polarizing plates according to Comparative Example 11 and Comparative Example 12 revealed that they were 4.48% and 4.52%, respectively. The polarizing plate according to Comparative Example 8 was superior in anti-reflection performance to the polarizing plates according to Comparative Example 11 and Comparative Example 12 compared to a reflectance of 4.47 of the polarizing plate according to Comparative Example 8. In addition, evaluation of the bright-place contrasts of liquid crystal monitors, in which Comparative Example 11 and Comparative Example 8 were used, by visual observation revealed that as for the bright-place contrasts of the liquid crystal monitors in which the polarizing plates of Comparative Example 8 and Comparative Example 11 were used, Comparative Example 8 was slightly superior. This is considered to be because the average refractive index N of the light transmissive film used in Comparative Example 11 and Comparative Example 12 was 1.61 and therefore, the average refractive index N was lower than $n_y$. Based on the results, it was confirmed that, even when a stretched light transmissive film is used, the light transmissive film is inferior in antireflection properties and bright-place contrast to an unstretched film in a case in which the light transmissive film does not satisfy the above-described expression (1) defined in the present invention.

EXPLANATION OF REFERENCE NUMERALS

10 Polarizing plate
11 Polarizer
12 Light transmissive film
13 Functional layer
20 Image display apparatus

The invention claimed is:
1. An image display apparatus comprising a polarizing plate, wherein the polarizing plate comprises:
   a polarizer; and
   a light transmissive film with a birefringent property in a plane, disposed on one surface of the polarizer, wherein the light transmissive film satisfies a relationship according to the following expression (1): $n_x>N>n_y$, wherein a refractive index in a slow-axis direction, which is a direction with a greatest refractive index in a plane of the light transmissive film, is $n_x$, wherein a refractive index in a fast-axis direction, which is a direction orthogonal to the slow-axis direction in the plane, is $n_y$, and wherein an average refractive index of the light transmissive film is N,
   wherein the polarizer and the light transmissive film are placed so that both the fast-axis direction of the light transmissive film and an absorption-axis direction of the polarizer are parallel to each other,
   wherein the polarizing plate is placed so that both the fast-axis direction of the light transmissive film and the absorption-axis direction of the polarizer are arranged along a horizontal direction, and
   wherein the image display apparatus comprises a λ/4 phase difference plate and is an organic electroluminescence display, whereby the polarizing plate is placed on a side of the image display apparatus that is closer to an observer than the λ/4 phase difference plate.
2. The image display apparatus according to claim 1, wherein the polarizing plate is placed so that the light transmissive film is located on a side of the image display apparatus that is closer to an observer than the polarizer.
3. The image display apparatus according to claim 2, wherein the image display apparatus further comprises a display element, and the polarizing plate is placed on a side of the image display apparatus that is closer to an observer than the display element.

4. The image display apparatus according to claim 1, wherein a difference ($n_x-n_y$) between the refractive index ($n_x$) in the slow-axis direction of the light transmissive film, and the refractive index ($n_y$) in the fast-axis direction, which is a direction orthogonal to the slow-axis direction, is 0.01 or more and 0.30 or less.

5. The image display apparatus according to claim 4, wherein the difference ($n_x-n_y$) between the refractive index ($n_y$) in the slow-axis direction of the light transmissive film, and the refractive index ($n_y$) in the fast-axis direction, which is the direction orthogonal to the slow-axis direction, is 0.07 to 0.25.

6. The image display apparatus according to claim 1, wherein the light transmissive film is one of a polyester film and a polycarbonate film.

7. The image display apparatus according to claim 1, wherein the polarizing plate further comprises a functional layer, which is formed on a plane of the light transmissive film that is opposite to a plane on which the polarizer is formed, and of which a refractive index in a direction parallel to the fast-axis direction of the light transmissive film is lower than a refractive index in the fast-axis direction of the light transmissive film.

8. The image display apparatus according to claim 7, wherein the functional layer is one of a hard coat layer and an antiglare layer.

9. The image display apparatus according to claim 7, wherein the average refractive index of the light transmissive film is higher than an average refractive index of the functional layer.

10. A method for improving bright-place contrast in an image display apparatus comprising a polarizing plate and λ/4 phase difference plate, the method comprising the steps of:
providing the λ/4 phase difference plate;
providing polarizing plate, wherein the polarizing plate comprises a polarizer and a light transmissive film with a birefringent property in a plane that is disposed on one surface of the polarizer, wherein the light transmissive film satisfies a relationship according to the following expression (1): $n_x>N>n_y$, wherein a refractive index in a slow-axis direction, which is a direction with a greatest refractive index in a plane of the light transmissive film, is $n_x$, wherein a refractive index in a fast-axis direction, which is a direction orthogonal to the slow-axis direction in the plane, is $n_y$, and wherein an average refractive index of the light transmissive film is N;
placing the polarizer and the light transmissive film so that both the fast-axis direction of the light transmissive film and an absorption-axis direction of the polarizer are parallel to each other;
placing the polarizing plate in the image display apparatus so that both the fast-axis direction of the light transmissive film and the absorption-axis direction of the polarizer in the polarizing plate are arranged along a horizontal direction; and
wherein the image display apparatus is an organic electroluminescence display, whereby the polarizing plate is placed on a side of the image display apparatus that is closer to an observer than the λ/4 phase difference plate.

11. The method according to claim 10, wherein the polarizing plate is placed so that the light transmissive film is located on a side of the image display apparatus that is closer to an observer than the polarizer.

12. The method according to claim 11, wherein the image display apparatus further comprises a display element, and the polarizing plate is placed on a side of the image display apparatus that is closer to an observer than the display element.

13. The method according to claim 10, wherein a difference ($n_x-n_y$) between the refractive index ($n_y$) in the slow-axis direction of the light transmissive film and the refractive index ($n_y$) in the fast-axis direction, which is a direction orthogonal to the slow-axis direction, is 0.01 or more and 0.30 or less.

14. The method according to claim 13, wherein the difference ($n_x-n_y$) between the refractive index ($n_x$) in the slow-axis direction of the light transmissive film and the refractive index ($n_y$) in the fast-axis direction, which is the direction orthogonal to the slow-axis direction, is 0.07 to 0.25.

15. The method according to claim 10, wherein the light transmissive film is one of a polyester film and a polycarbonate film.

16. The method according to claim 10, wherein the polarizing plate further comprises a functional layer, which is formed on a plane opposite to a plane of the light transmissive film, on which the polarizer is formed, and of which a refractive index in a direction parallel to the fast-axis direction of the light transmissive film is lower than a refractive index in the fast-axis direction of the light transmissive film.

17. The method according to claim 16, wherein the functional layer is one of a hard coat layer and an antiglare layer.

18. The method according to claim 16, wherein the average refractive index of the light transmissive film is higher than an average refractive index of the functional layer.

* * * * *